(12) United States Patent
Song

(10) Patent No.: US 8,928,370 B2
(45) Date of Patent: Jan. 6, 2015

(54) DESERIALIZERS

(71) Applicant: SK hynix Inc., Icheon-si, Gyeonggi-do (KR)

(72) Inventor: Keun Soo Song, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/446,574

(22) Filed: Jul. 30, 2014

(65) Prior Publication Data

US 2014/0344611 A1    Nov. 20, 2014

Related U.S. Application Data

(62) Division of application No. 13/846,906, filed on Mar. 18, 2013, now Pat. No. 8,823,426.

(30) Foreign Application Priority Data

Oct. 24, 2012 (KR) .................. 10-2012-0118497
Oct. 24, 2012 (KR) .................. 10-2012-0118498
Nov. 29, 2012 (KR) .................. 10-2012-0137369

(51) Int. Cl.
*H03K 21/00* (2006.01)
*H03K 23/00* (2006.01)
*H03K 25/00* (2006.01)
*H03K 5/00* (2006.01)
*H03M 9/00* (2006.01)

(52) U.S. Cl.
CPC ............. *H03K 5/00006* (2013.01); *H03M 9/00* (2013.01)
USPC .......................................... 327/115; 327/114

(58) Field of Classification Search
USPC .................................................. 327/114, 115
See application file for complete search history.

(56) References Cited

U.S. PATENT DOCUMENTS

| 7,626,523 | B2 * | 12/2009 | Shin et al. | 341/101 |
|---|---|---|---|---|
| 8,300,754 | B2 * | 10/2012 | Nedovic et al. | 375/355 |
| 8,424,012 | B1 * | 4/2013 | Karandikar et al. | 718/108 |
| 8,823,426 | B2 * | 9/2014 | Song | 327/115 |
| 2002/0048270 | A1 * | 4/2002 | Allen et al. | 370/392 |
| 2009/0167750 | A1 * | 7/2009 | Hong et al. | 345/213 |
| 2010/0241918 | A1 * | 9/2010 | Nedovic | 714/746 |
| 2011/0150060 | A1 | 6/2011 | Huang et al. | |
| 2012/0192190 | A1 * | 7/2012 | Basso et al. | 718/102 |
| 2012/0200542 | A1 * | 8/2012 | Hong et al. | 345/204 |
| 2014/0035640 | A1 * | 2/2014 | Kwak et al. | 327/158 |
| 2014/0111256 | A1 * | 4/2014 | Song | 327/115 |

* cited by examiner

*Primary Examiner* — Adam Houston
(74) *Attorney, Agent, or Firm* — William Park & Associates Patent Ltd.

(57) ABSTRACT

Deserializers are provided. The deserializer includes a data aligner, a selection signal generator and a selection output unit. The data aligner is configured to align data in response to internal clock signals having different phases from each other to generate higher aligned data and lower aligned data. The selection signal generator is configured to detect a phase of one of the internal clock signals in response to a phase detection signal to generate a selection signal. The phase detection signal includes a pulse generated according to a write command signal and a write latency signal. The selection output unit is configured to output the higher aligned data or the lower aligned data as selected alignment data in response to the selection signal.

12 Claims, 13 Drawing Sheets

DESERIALIZERS

CROSS-REFERENCE TO RELATED APPLICATION

The present application claims priority under 35 U.S.C. 119(a) to Korean Applications No. 10-2012-0118497, No. 10-2012-0118498, filed on Oct. 24, 2012, and No. 10-2012-0137369, filed on Nov. 29, 2012, in the Korean Intellectual Property Office, which is incorporated herein by reference in its entirety as set forth in full.

BACKGROUND

As semiconductor systems are developed to operate at a high speed, high data transmission rates (or data communication at high bandwidth) between semiconductor chips constituting each semiconductor system have been increasingly in demand. In response to such a demand, various pre-fetch schemes have been proposed. The pre-fetch scheme may correspond to a design technique that latches data inputted in series and outputs the latched data in parallel. To obtain the parallel data, clock signals having different phases, for example, multi-phase clock signals are generated in the semiconductor chips and the multi-phase clock signals are used to input or output the data.

SUMMARY

Embodiments are directed to deserializers.

According to various embodiments, a deserializer includes a data aligner, a selection signal generator and a selection output unit. The data aligner is configured to align data in response to internal clock signals having different phases from each other to generate higher aligned data and lower aligned data. The selection signal generator is configured to detect a phase of one of the internal clock signals in response to a phase detection signal to generate a selection signal. The phase detection signal includes a pulse generated according to a write command signal and a write latency signal. The selection output unit is configured to output the higher aligned data or the lower aligned data as selected alignment data in response to the selection signal.

According to further embodiments, a deserializer includes an internal clock generator configured to divide a data strobe signal and a complementary data strobe signal to generate internal clock signals, a data aligner configured to align data in response to the internal clock signals to generate higher aligned data and lower aligned data, a phase detection signal generator configured to generate a phase detection signal including a pulse generated according to a write command signal and a write latency signal, a selection signal generator configured to detect a phase of one of the internal clock signals in response to the phase detection signal to generate a selection signal, and a selection output unit configured to output the higher aligned data or the lower aligned data as selected alignment data in response to the selection signal.

According to further embodiments, a deserializer includes a selection signal generator configured to detect a phase of one of an internal clock signals in response to a phase detection signal including a pulse generated according to a write command signal and a write latency to generate a selection signal, a clock phase controller configured to output the internal clock signals or inversed signals of the internal clock signals as transformed clock signals in response to the selection signal, and a data aligner configured to align data in response to the transformed clock signals to generate aligned data.

According to further embodiments, a deserializer includes an internal clock generator configured to divide a data strobe signal and a complementary data strobe signal to generate internal clock signals, a phase detection signal generator configured to generate a phase detection signal including a pulse generated according to a write command signal and a write latency, a selection signal generator configured to detect a phase of one of the internal clock signals in response to the phase detection signal to generate a selection signal, a clock phase controller configured to output the internal clock signals or inversed signals of the internal clock signals as transformed clock signals in response to the selection signal, and a data aligner configured to align data in response to the transformed clock signals to generate aligned data.

According to further embodiments, a deserializer includes a selection signal generator configured to detect a phase of one of an internal clock signals in response to a phase detection signal including a first pulse generated according to a write command signal and a write latency to generate a selection signal, a first selector configured to output a first alignment data group or a second alignment data group as a first selected alignment data group in response to the selection signal, and a second selector configured to output the first alignment data group or the second alignment data group as a second selected alignment data group in response to the selection signal.

According to further embodiments, a deserializer includes a phase controller, a data selector and an internal data generator. The phase controller is configured to generate a phase detection signal, a first data input clock signal and a second data input clock signal including respective ones of a first pulse, a second pulse and a third pulse which are created according to a write command signal and a write latency. The data selector is configured to output a first alignment data group or a second alignment data group as a first selected alignment data group in response to a selection signal and output the first alignment data group or the second alignment data group as a second selected alignment data group in response to the selection signal. The selection signal is generated by detecting a phase of one of first to fourth internal clock signals in response to the phase detection signal. The internal data generator is configured to latch the first selected alignment data group in response to the first data input clock signal to generate a first internal data group and is configured to latch the second selected alignment data group in response to the second data input clock signal to generate a second internal data group.

According to further embodiments, a method of deserializing, includes aligning data in response to internal clock signals having different phases from each other for generating higher aligned data and lower aligned data; detecting a phase of one of the first to fourth internal clock signals in response to a phase detection signal including a pulse generated according to a write command signal and a write latency signal to generate a selection signal; and outputting the higher aligned data or the lower aligned data as selected alignment data in response to the selection signal.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Various embodiments of the inventive concept will be described more fully hereinafter with reference to the accompanying drawings. However, the various embodiments described herein are for illustrative purposes only and are not intended to limit the scope of the inventive concept.

Figure 1:
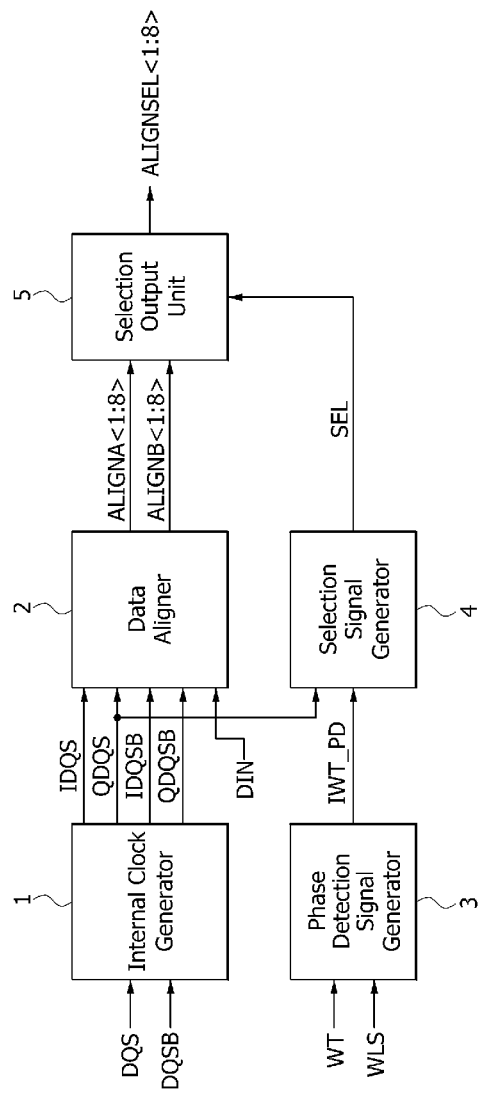
FIG. 1 is a block diagram illustrating a configuration of a deserializer according to an embodiment.

FIG. 1 is a block diagram illustrating a configuration of a deserializer according to various embodiments.

As illustrated in FIG. 1, a deserializer according to various embodiments may be configured to include an internal clock generator 1, a data aligner 2, a phase detection signal generator 3, a selection signal generator 4 and a selection output unit 5.

The internal clock generator 1 may divide a data strobe signal DQS and a complementary data strobe signal DQSB to generate a first internal clock signal IDQS, a second internal clock signal QDQS, a third internal clock signal IDQSB and a fourth internal clock signal QDQSB. The internal clock generator 1 may be configured to include a frequency divider. Accordingly, the first to fourth internal clock signals IDQS, QDQS, IDQSB and QDQSB may be generated to have a period (e.g., a cycle time) which is twice that of the data strobe signal DQS and the complementary data strobe signal DQSB. The first internal clock signal IDQS may precede the second internal clock signal QDQS by a phase of 90 degrees, the second internal clock signal QDQS may precede the third internal clock signal IDQSB by a phase of 90 degrees, and the third internal clock signal IDQSB may precede the fourth internal clock signal QDQSB by a phase of 90 degrees.

The data aligner 2 may align data DIN in response to the first to fourth internal clock signals IDQS, QDQS, IDQSB and QDQSB to generate to generate first to eighth higher aligned data ALIGNA<1:8> and first to eighth lower aligned data ALIGNB<1:8>. The first to eighth higher aligned data ALIGNA<1:8> may be rightly aligned when the phases of the first to fourth internal clock signals IDQS, QDQS, IDQSB and QDQSB are normal. In contrast, the first to eighth lower aligned data ALIGNB<1:8> may be rightly aligned when the phases of the first to fourth internal clock signals IDQS, QDQS, IDQSB and QDQSB are inversed. Detailed descriptions to the configuration and operation of the data aligner 2 will be described with reference to FIG. 2 later.

The phase detection signal generator 3 may receive a write command signal WT and a write latency signal WLS to generate a phase detection signal IWT_PD after a write latency WL (WL of FIGS. 3 and 4) and a predetermined time, which corresponds to "N" (wherein, "N" denotes a positive integer) times a cycle of a clock signal CLK, elapse from a point of time that the write command signal WT is inputted. According to the present embodiments, in order to sense or detect the phase of the second internal clock signal QDQS, the phase detection signal IWT_PD may be generated after the write latency WL and two times the cycle of a clock signal CLK elapse from a point of time that the write command signal WT is applied to phase detection signal generator 3. In various embodiments, the phase detection signal IWT_PD may be generated to sense or detect one of the phases of the first to fourth internal clock signals IDQS, QDQS, IDQSB and QDQSB.

The selection signal generator 4 may detect one of the first to fourth internal clock signals IDQS, QDQS, IDQSB and QDQSB in response to the phase detection signal IWT_PD to generate a selection signal SEL. In the present embodiments, a logic level of the selection signal SEL may be determined according to a phase of the second internal clock signal QDQS at a point of time that the phase detection signal IWT_PD is generated. That is, the selection signal SEL may be generated to have a logic "high" level when the second internal clock signal QDQS has a logic "high" level at a rising edge of the phase detection signal IWT_PD, and the selection signal SEL may be generated to have a logic "low" level when the second internal clock signal QDQS has a logic "low" level at a rising edge of the phase detection signal IWT_PD.

The selection output unit 5 may output the first to eighth higher aligned data ALIGNA<1:8> or the first to eighth lower aligned data ALIGNB<1:8> as first to eighth selected alignment data ALIGNSEL<1:8> according to a logic level of the selection signal SEL. In the present embodiments, the selection output unit 5 may output the first to eighth higher aligned data ALIGNA<1:8> as the first to eighth selected alignment data ALIGNSEL<1:8> when the selection signal SEL has a logic "high" level, and the selection output unit 5 may output the first to eighth lower aligned data ALIGNB<1:8> as the first to eighth selected alignment data ALIGNSEL<1:8> when the selection signal SEL has a logic "low" level.

Figure 2:
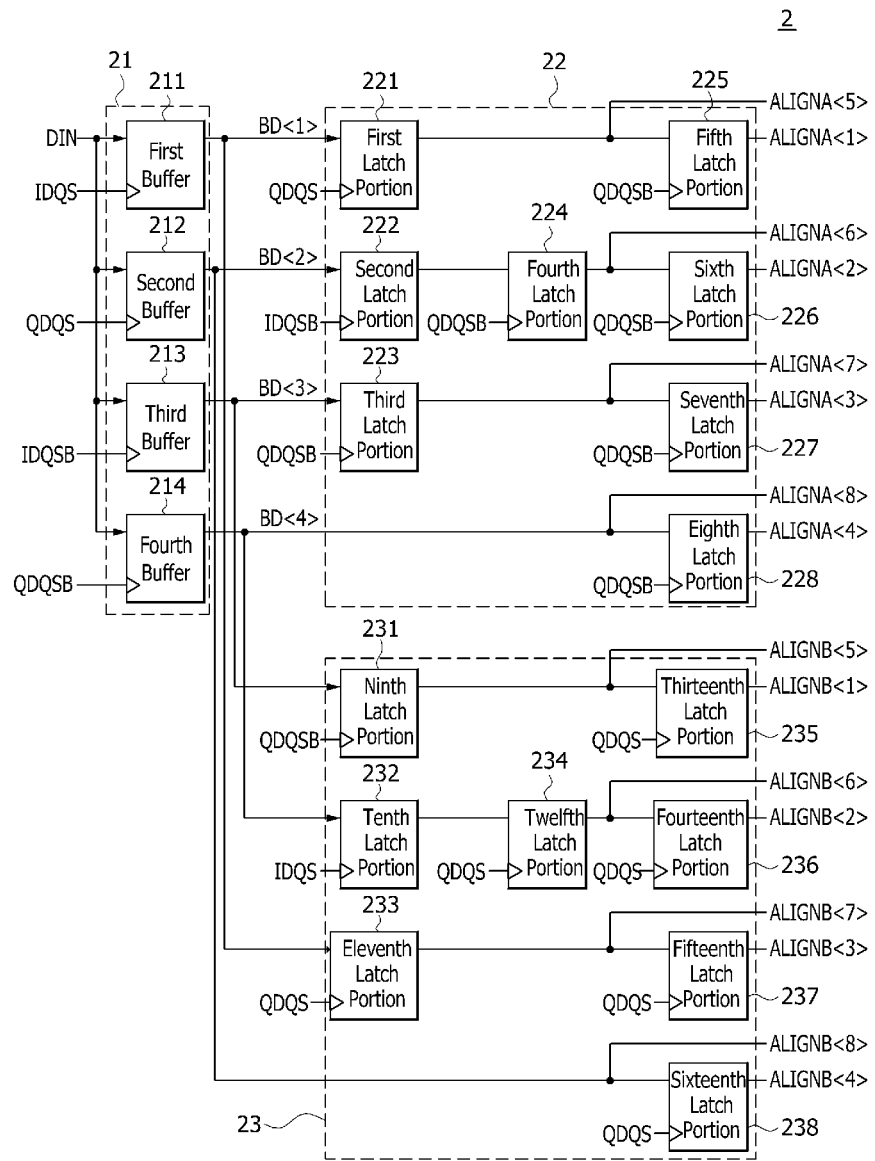
FIG. 2 is a block diagram illustrating a data aligner included in the deserializer of FIG. 1.

FIG. 2 is a block diagram illustrating a configuration of the data aligner 2 included in the deserializer of FIG. 1.

As illustrated in FIG. 2, the data aligner 2 may be configured to include a data buffer 21, a first aligner 22 and a second aligner 23. The data buffer 21 may be configured to include a first buffer 211, a second buffer 212, a third buffer 213 and a fourth buffer 214. The first aligner 22 may be configured to include a first latch portion 221, a second latch portion 222, a third latch portion 223, a fourth latch portion 224, a fifth latch portion 225, a sixth latch portion 226, a seventh latch portion 227 and an eighth latch portion 228. The second aligner 23 may be configured to include a ninth latch portion 231, a tenth latch portion 232, an eleventh latch portion 233, a twelfth latch portion 234, a thirteenth latch portion 235, a fourteenth latch portion 236, a fifteenth latch portion 237 and a sixteenth latch portion 238.

The first buffer 211 may buffer the data DIN in synchronization with a rising edge of the first internal clock signal IDQS to output a first buffer data BD<1>. The second buffer 212 may buffer the data DIN in synchronization with a rising edge of the second internal clock signal QDQS to output a second buffer data BD<2>. The third buffer 213 may buffer the data DIN in synchronization with a rising edge of the third internal clock signal IDQSB to output a third buffer data BD<3>. The fourth buffer 214 may buffer the data DIN in synchronization with a rising edge of the fourth internal clock signal QDQSB to output a fourth buffer data BD<4>. Each of the first to fourth buffers 211, 212, 213 and 214 may be realized to include a flip-flop. Thus, each of the first to fourth buffers 211, 212, 213 and 214 may latch and buffer its input data and may output the latched and buffered input data.

The first latch portion 221 may latch and output the first buffer data BD<1> in synchronization with a rising edge of the second internal clock signal QDQS. The second latch portion 222 may latch and output the second buffer data BD<2> in synchronization with a rising edge of the third internal clock signal IDQSB. The third latch portion 223 may latch and output the third buffer data BD<3> in synchronization with a rising edge of the fourth internal clock signal QDQSB. The fourth latch portion 224 may latch and output an output signal of the second latch portion 222 in synchronization with a rising edge of the fourth internal clock signal QDQSB. The fifth latch portion 225 may latch and output an output signal of the first latch portion 221 in synchronization with a rising edge of the fourth internal clock signal QDQSB. The sixth latch portion 226 may latch and output an output signal of the fourth latch portion 224 in synchronization with a rising edge of the fourth internal clock signal QDQSB. The seventh latch portion 227 may latch and output an output signal of the third latch portion 223 in synchronization with a rising edge of the fourth internal clock signal QDQSB. The eighth latch portion 228 may latch and output the fourth buffer data BD<4> in synchronization with a rising edge of the fourth internal clock signal QDQSB. Each of the first to eighth latch portions 221, 222, 223, 224, 225, 226, 227 and 228 may be realized to include a flip-flop. Thus, each of the first to eighth latch portions 221, 222, 223, 224, 225, 226, 227 and 228 may latch and buffer its input data and may output the latched and buffered input data.

An output signal of the first latch portion 221 may correspond to the fifth higher aligned data ALIGNA<5>, and an output signal of the fifth latch portion 225 may correspond to the first higher aligned data ALIGNA<1>. Further, an output signal of the fourth latch portion 224 may correspond to the sixth higher aligned data ALIGNA<6>, and an output signal of the sixth latch portion 226 may correspond to the second higher aligned data ALIGNA<2>. Moreover, an output signal of the third latch portion 223 may correspond to the seventh higher aligned data ALIGNA<7>, and an output signal of the seventh latch portion 227 may correspond to the third higher aligned data ALIGNA<3>. Furthermore, the fourth buffer data BD<4> may correspond to the eighth higher aligned data ALIGNA<8>, and an output signal of the eighth latch portion 228 may correspond to the fourth higher aligned data ALIGNA<4>.

The ninth latch portion 231 may latch and output the third buffer data BD<3> in synchronization with a rising edge of the fourth internal clock signal QDQSB. The tenth latch portion 232 may latch and output the fourth buffer data BD<4> in synchronization with a rising edge of the first internal clock signal IDQS. The eleventh latch portion 233 may latch and output the first buffer data BD<1> in synchronization with a rising edge of the second internal clock signal QDQS. The twelfth latch portion 234 may latch and output an output signal of the tenth latch portion 232 in synchronization with a rising edge of the second internal clock signal QDQS. The thirteenth latch portion 235 may latch and output an output signal of the ninth latch portion 231 in synchronization with a rising edge of the second internal clock signal QDQS. The fourteenth latch portion 236 may latch and output an output signal of the twelfth latch portion 234 in synchronization with a rising edge of the second internal clock signal QDQS. The fifteenth latch portion 237 may latch and output an output signal of the eleventh latch portion 233 in synchronization with a rising edge of the second internal clock signal QDQS. The sixteenth latch portion 238 may latch and output the second buffer data BD<2> in synchronization with a rising edge of the second internal clock signal QDQS. Each of the ninth to sixteenth latch portions 231, 232, 233, 234, 235, 236, 237 and 238 may be realized to include a flip-flop. Thus, each of the ninth to sixteenth latch portions 231, 232, 233, 234, 235, 236, 237 and 238 may latch and buffer its input data and may output the latched and buffered input data.

An output signal of the ninth latch portion 231 may correspond to the fifth lower aligned data ALIGNB<5>, and an output signal of the thirteenth latch portion 235 may correspond to the first lower aligned data ALIGNB<1>. Further, an output signal of the twelfth latch portion 234 may correspond to the sixth lower aligned data ALIGNB<6>, and an output signal of the fourteenth latch portion 236 may correspond to the second lower aligned data ALIGNB<2>. Moreover, an output signal of the eleventh latch portion 233 may correspond to the seventh lower aligned data ALIGNB<7>, and an output signal of the fifteenth latch portion 237 may correspond to the third lower aligned data ALIGNB<3>. Furthermore, the second buffer data BD<2> may correspond to the eighth lower aligned data ALIGNB<8>, and an output signal of the sixteenth latch portion 238 may correspond to the fourth lower aligned data ALIGNB<4>.

The data aligner 2 may latch and align the first buffer data BD<1>, the second buffer data BD<2>, the third buffer data BD<3> and the fourth buffer data BD<4> in order through the first aligner 22 to generate the first to eighth higher aligned data ALIGNA<1:8> when the phases of the first to fourth internal clock signals IDQS, QDQS, IDQSB and QDQSB are normal at a point of time that the data DIN is inputted. Alternatively, the data aligner 2 may latch and align the third buffer data BD<3>, the fourth buffer data BD<4>, the first buffer data BD<1> and the second buffer data BD<2> in order through the second aligner 23 to generate the first to eighth lower aligned data ALIGNB<1:8> when the phases of the first to fourth internal clock signals IDQS, QDQS, IDQSB and QDQSB are inversed at a point of time that the data DIN is inputted.

The operations of the aforementioned deserializer will be described more fully hereinafter with reference to FIGS. 3 and 4. The operation of the deserializer when the first to fourth internal clock signals IDQS, QDQS, IDQSB and QDQSB are generated to have the normal phases and the operation of the deserializer when the first to fourth internal clock signals IDQS, QDQS, IDQSB and QDQSB are generated to have the inversed phases will be separately described. In the present embodiment, for the purpose of ease and convenience in explanation, it is assumed that the write latency WL is set to "2" and a preamble time tWPRE (e.g., a time "tDQSS") is set to "1tCK". The preamble time tWPRE may be defined as a term from a point of time that the write latency WL terminates to a point of time that the data DIN is inputted. Although the preamble time tWPRE, that is, the time "tDQSS" is set to have a single cycle time (tCK or 1tCK) of the clock signal CLK in the present embodiment, the preamble time tWPRE may be set to have "tDQSS+positive integer×tCK" in other embodiments.

Now, the operation of the deserializer when the first to fourth internal clock signals IDQS, QDQS, IDQSB and QDQSB are generated to have the normal phases will be described hereinafter with reference to FIG. 3.

If the write command signal WT is inputted at a point of time t11, the data DIN may be inputted to the data aligner 2 at a point of time t13 that the write latency WL and the time tDQSS elapse from the point of time t11 and the phase detection signal IWT_PD may be generated at a point of time t15 that the time 2tCK (e.g., two cycle times of the clock signal CLK) elapses from a point of time t12 that the write latency WL terminates.

The first to fourth internal clock signals IDQS, QDQS, IDQSB and QDQSB may be normally generated from the point of time t13 that the time tDQSS elapses from the point of time t12. That is, the first internal clock signal IDQS may be generated to have a predetermined cycle time after the point of time t13, and the second internal clock signal QDQS may be generated to have the predetermined cycle time after a point of time t14 which is delayed from the point of time t13 by a phase of 90 degrees. Further, the third internal clock signal IDQSB may be generated to have the predetermined cycle time after the point of time t15 which is delayed from the point of time t14 by a phase of 90 degrees, and the fourth internal clock signal QDQSB may be generated to have the predetermined cycle time after a point of time t16 which is delayed from the point of time t15 by a phase of 90 degrees.

Figure 3:
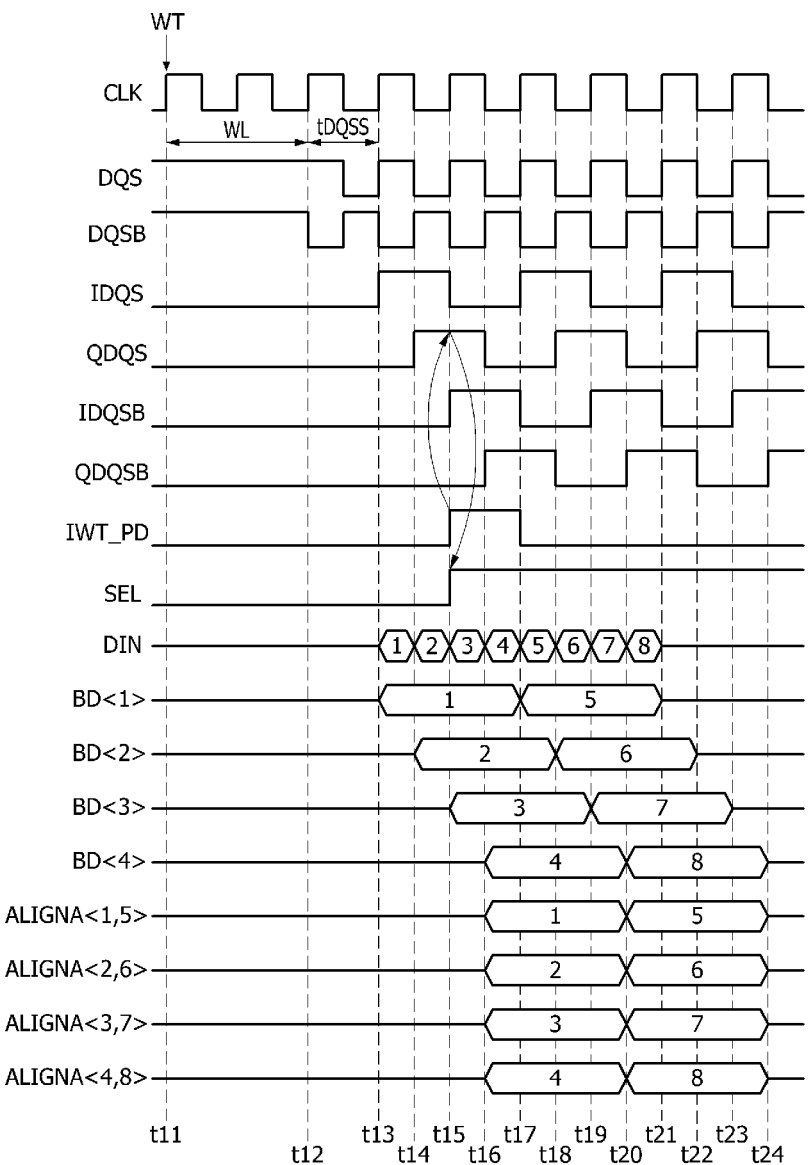
FIGS. 3 and 4 are timing diagrams illustrating an operation of the deserializer shown in FIG. 1.

The second internal clock signal QDQS may have a logic "high" level at the point of time t15 that corresponds to a rising edge of the phase detection signal IWT_PD, as illustrated in FIG. 3. Thus, the selection signal SEL may be generated to have a logic "high" level from the point of time t15. As a result, the selection output unit 5 may select the first to eighth higher aligned data ALIGNA<1:8> of the first to eighth higher aligned data ALIGNA<1:8> and the first to eighth lower aligned data ALIGNB<1:8>, thereby outputting the first to eighth higher aligned data ALIGNA<1:8> as the first to eighth selected alignment data ALIGNSEL<1:8>. The first to eighth higher aligned data ALIGNA<1:8> may correspond to signals that the first to fourth buffer data BD<1:4> are latched in order and aligned in parallel through the first aligner (22 of FIG. 2), as illustrated in FIG. 3. In FIG. 3, reference designators t17, t18, t19, t20, t21, t22, t23 and t24 denote points of time which are sequentially delayed from the point of time t16 by a half cycle of the clock signal CLK, respectively.

The operation of the deserializer when the first to fourth internal clock signals IDQS, QDQS, IDQSB and QDQSB are generated to have the inversed phases will be described hereinafter with reference to FIG. 4.

If the write command signal WT is inputted at a point of time t31, the data DIN may be inputted to the data aligner 2 at a point of time t33 that the write latency WL and the time tDQSS elapse from the point of time t31 and the phase detection signal IWT_PD may be generated at a point of time t35 that the time 2tCK (e.g., two cycle times of the clock signal CLK) elapses from a point of time t32 that the write latency WL terminates.

The first to fourth internal clock signals IDQS, QDQS, IDQSB and QDQSB may be generated to have inversed phases from the point of time t32 that the write latency WL terminates. That is, the first to fourth internal clock signals IDQS, QDQS, IDQSB and QDQSB may be sequentially generated to have the inversed phases from the point of time t32. Specifically, the first to fourth internal clock signals IDQS, QDQS, IDQSB and QDQSB may be shifted by a phase of 180 degrees as compared with the first to fourth internal clock signals IDQS, QDQS, IDQSB and QDQSB illustrated in FIG. 3.

Figure 4:
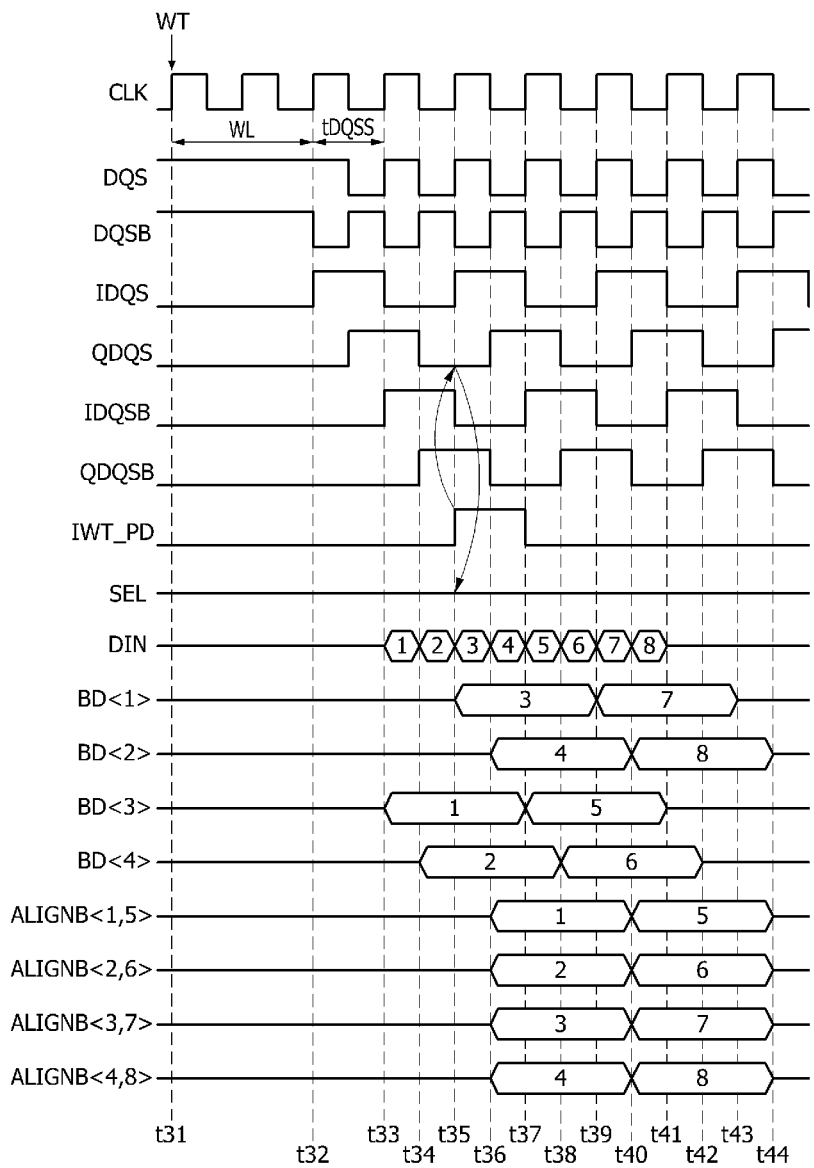

The second internal clock signal QDQS may have a logic "low" level at the point of time t35 that corresponds to a rising edge of the phase detection signal IWT_PD, as illustrated in FIG. 4. Thus, the selection output unit 5 may select the first to eighth lower aligned data ALIGNB<1:8> of the first to eighth higher aligned data ALIGNA<1:8> and the first to eighth lower aligned data ALIGNB<1:8>, thereby outputting the first to eighth lower aligned data ALIGNB<1:8> as the first to eighth selected alignment data ALIGNSEL<1:8>. The first to eighth lower aligned data ALIGNB<1:8> may correspond to signals that the third buffer data BD<3>, the fourth buffer data BD<4>, the first buffer data BD<1> and the second buffer data BD<2> are latched in order and aligned in parallel through the second aligner (23 of FIG. 2), as illustrated in FIG. 4.

As described above, the deserializer according to the embodiments may align data, which are serially inputted, either when internal clock signals are generated to have normal phases or when the internal clock signals are generated to have inversed phases, and may detect a phase of one of the internal clock signals at a certain point of time to selectively output a specific group of the aligned data. Accordingly, the input data may be aligned without any errors even though the internal clock signals are generated to have the inversed phases.

Figure 5:
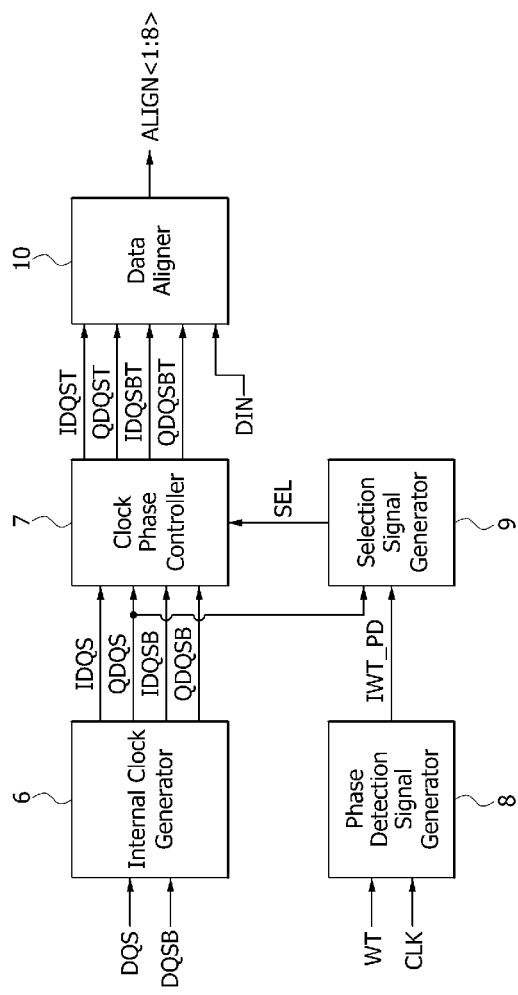
FIG. 5 is a block diagram illustrating a configuration of a deserializer according to an embodiment.

FIG. 5 is a block diagram illustrating a configuration of a deserializer according to various other embodiments.

As illustrated in FIG. 5, a deserializer according to an embodiment may be configured to include an internal clock generator 6, a clock phase controller 7, a phase detection signal generator 8, a selection signal generator 9 and a data aligner 10.

The internal clock generator 6 may divide a data strobe signal DQS and a complementary data strobe signal DQSB to generate a first internal clock signal IDQS, a second internal clock signal QDQS, a third internal clock signal IDQSB and a fourth internal clock signal QDQSB. The internal clock generator 6 may be configured to include a frequency divider. Accordingly, the first to fourth internal clock signals IDQS, QDQS, IDQSB and QDQSB may be generated to have a period (e.g., a cycle time) which is twice that of the data strobe signal DQS and the complementary data strobe signal DQSB. The first internal clock signal IDQS may precede the second internal clock signal QDQS by a phase of 90 degrees, the second internal clock signal QDQS may precede the third internal clock signal IDQSB by a phase of 90 degrees, and the third internal clock signal IDQSB may precede the fourth internal clock signal QDQSB by a phase of 90 degrees.

The clock phase controller 7 may output the first to fourth internal clock signals IDQS, QDQS, IDQSB and QDQSB or inversed signals of the first to fourth internal clock signals IDQS, QDQS, IDQSB and QDQSB as first to fourth transformed clock signals IDQST, QDQST, IDQSBT and QDQSBT in response to a selection signal SEL. For example, the clock phase controller 7 may output the first to fourth internal clock signals IDQS, QDQS, IDQSB and QDQSB as the first to fourth transformed clock signals IDQST, QDQST, IDQSBT and QDQSBT when the selection signal SEL has a logic "high" level, and the clock phase controller 7 may output the inversed signals of the first to fourth internal clock signals IDQS, QDQS, IDQSB and QDQSB as the first to fourth transformed clock signals IDQST, QDQST, IDQSBT and QDQSBT when the selection signal SEL has a logic "low" level.

The phase detection signal generator 8 may receive a write command signal WT and a write latency signal WLS to generate a phase detection signal IWT_PD after a write latency WL (WL of FIGS. 7 and 8) and a predetermined time, which corresponds to "N" (wherein, "N" denotes a positive integer) times a cycle of the system clock signal CLK, elapse from a point of time that the write command signal WT is inputted. According to the present embodiment, in order to sense or detect the phase of the second internal clock signal QDQS, the phase detection signal IWT_PD may be generated after the write latency WL and one cycle (1tCK) of the system clock signal CLK elapse from a point of time that the write command signal WT is applied to phase detection signal generator 8. In various embodiments, the phase detection signal IWT_PD may be generated to sense or detect one of the phases of the first to fourth internal clock signals IDQS, QDQS, IDQSB and QDQSB.

The selection signal generator 9 may detect one of the first to fourth internal clock signals IDQS, QDQS, IDQSB and QDQSB in response to the phase detection signal IWT_PD to generate a selection signal SEL. In the present embodiment, a logic level of the selection signal SEL may be determined according to a phase of the second internal clock signal QDQS at a point of time that the phase detection signal IWT_PD is generated. That is, the selection signal SEL may be generated to have a logic "high" level when the second internal clock signal QDQS has a logic "high" level at a rising edge of the phase detection signal IWT_PD, and the selection signal SEL may be generated to have a logic "low" level when the second internal clock signal QDQS has a logic "low" level at a rising edge of the phase detection signal IWT_PD.

The data aligner 10 may align data DIN in response to the first to fourth transformed clock signals IDQST, QDQST, IDQSBT and QDQSBT to generate to generate first to eighth aligned data ALIGN<1:8>. Detailed descriptions to the configuration and operation of the data aligner 10 will be described with reference to FIG. 6.

Figure 6:
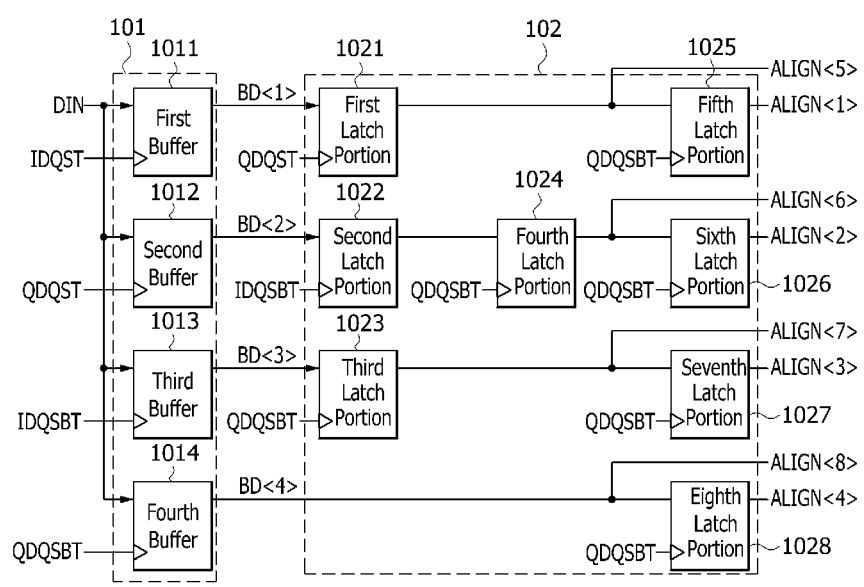
FIG. 6 is a block diagram illustrating a data aligner included in the deserializer of FIG. 5.

FIG. 6 is a block diagram illustrating a configuration of the data aligner 10 included in the deserializer of FIG. 5.

As illustrated in FIG. 6, the data aligner 10 may be configured to include a data buffer 101 and an aligner 102. The data buffer 101 may be configured to include a first buffer 1011, a second buffer 1012, a third buffer 1013 and a fourth buffer 1014. The aligner 102 may be configured to include a first latch portion 1021, a second latch portion 1022, a third latch portion 1023, a fourth latch portion 1024, a fifth latch portion 1025, a sixth latch portion 1026, a seventh latch portion 1027 and an eighth latch portion 1028.

The first buffer 1011 may buffer the data DIN in synchronization with a rising edge of the first transformed clock signal IDQST to output a first buffer data BD<1>. The second buffer 1012 may buffer the data DIN in synchronization with a rising edge of the second transformed clock signal QDQST to output a second buffer data BD<2>. The third buffer 1013 may buffer the data DIN in synchronization with a rising edge of the third transformed clock signal IDQSBT to output a third buffer data BD<3>. The fourth buffer 1014 may buffer the data DIN in synchronization with a rising edge of the fourth transformed clock signal QDQSBT to output a fourth buffer data BD<4>. Each of the first to fourth buffers 1011, 1012, 1013 and 1014 may be realized to include a flip-flop. Thus, each of the first to fourth buffers 1011, 1012, 1012 and 1014 may latch and buffer its input data and may output the latched and buffered input data.

The first latch portion 1021 may latch and output the first buffer data BD<1> in synchronization with a rising edge of the second transformed clock signal QDQST. The second latch portion 1022 may latch and output the second buffer data BD<2> in synchronization with a rising edge of the third transformed clock signal IDQSBT. The third latch portion 1023 may latch and output the third buffer data BD<3> in synchronization with a rising edge of the fourth transformed clock signal QDQSBT. The fourth latch portion 1024 may latch and output an output signal of the second latch portion 1022 in synchronization with a rising edge of the fourth transformed clock signal QDQSBT. The fifth latch portion 1025 may latch and output an output signal of the first latch portion 1021 in synchronization with a rising edge of the fourth transformed clock signal QDQSBT. The sixth latch portion 1026 may latch and output an output signal of the fourth latch portion 1024 in synchronization with a rising edge of the fourth transformed clock signal QDQSBT. The seventh latch portion 1027 may latch and output an output signal of the third latch portion 1023 in synchronization with a rising edge of the fourth transformed clock signal QDQSBT. The eighth latch portion 1028 may latch and output the fourth buffer data BD<4> in synchronization with a rising edge of the fourth transformed clock signal QDQSBT.

An output signal of the first latch portion 1021 may correspond to the fifth aligned data ALIGN<5>, and an output signal of the fifth latch portion 1025 may correspond to the first aligned data ALIGN<1>. Further, an output signal of the fourth latch portion 1024 may correspond to the sixth aligned data ALIGN<6>, and an output signal of the sixth latch portion 1026 may correspond to the second aligned data ALIGN<2>. Moreover, an output signal of the third latch portion 1023 may correspond to the seventh aligned data ALIGN<7>, and an output signal of the seventh latch portion 1027 may correspond to the third higher aligned data ALIGN<3>. Furthermore, the fourth buffer data BD<4> may correspond to the eighth aligned data ALIGN<8>, and an output signal of the eighth latch portion 1028 may correspond to the fourth aligned data ALIGN<4>.

The data aligner 10 may buffer the data DIN in response to the first to fourth transformed clock signals IDQST, QDQST, IDQSBT and QDQSBT at points of time that the data DIN are inputted and may latch and align the first to fourth buffer data BD<1>, BD<2>, BD<3> and BD<4> in order through the aligner 102 to generate the first to eighth aligned data ALIGN<1:8>.

The operations of the aforementioned deserializer will be described more fully hereinafter with reference to FIGS. 7 and 8. The operation of the deserializer when the first to fourth internal clock signals IDQS, QDQS, IDQSB and QDQSB are generated to have normal phases and the operation of the deserializer when the first to fourth internal clock signals IDQS, QDQS, IDQSB and QDQSB are generated to have inversed phases will be separately described. In the present embodiments, for the purpose of ease and convenience in explanation, it is assumed that the write latency WL is set to "2" and a preamble time tWPRE is set to four cycles "4tCK" of the system clock signal CLK. The preamble time tWPRE may be defined as a period between a point of time that the write latency WL terminates and a point of time that the data DIN is inputted. Although the preamble time tWPRE is set to have four cycle times "4tCK" of the system clock signal CLK in the present embodiment, the preamble time tWPRE may be set to have "positive integer×tCK" in other embodiments.

Now, the operation of the deserializer when the first to fourth internal clock signals IDQS, QDQS, IDQSB and QDQSB are generated to have the normal phases will be described hereinafter with reference to FIG. 7.

If the write command signal WT is inputted at a point of time t51, the data DIN may be inputted to the data aligner 10 at a point of time t56 that the write latency WL and the preamble time tWPRE elapse from the point of time t51 and the phase detection signal IWT_PD may be generated at a point of time t54 that one cycle time 1tCK of the system clock signal CLK elapses from a point of time t52 that the write latency WL terminates.

The first to fourth internal clock signals IDQS, QDQS, IDQSB and QDQSB may be generated to have the normal phases from the point of time t52 that the write latency WL terminates. That is, the first internal clock signal IDQS may be generated to have a predetermined cycle time after the point of time t52, and the second internal clock signal QDQS may be generated to have the predetermined cycle time after a point of time t53 which is delayed from the point of time t52 by a phase of 90 degrees. Further, the third internal clock signal IDQSB may be generated to have the predetermined cycle time after the point of time t54 which is delayed from the point of time t53 by a phase of 90 degrees, and the fourth internal clock signal QDQSB may be generated to have the predetermined cycle time after a point of time t55 which is delayed from the point of time t54 by a phase of 90 degrees.

Figure 7:
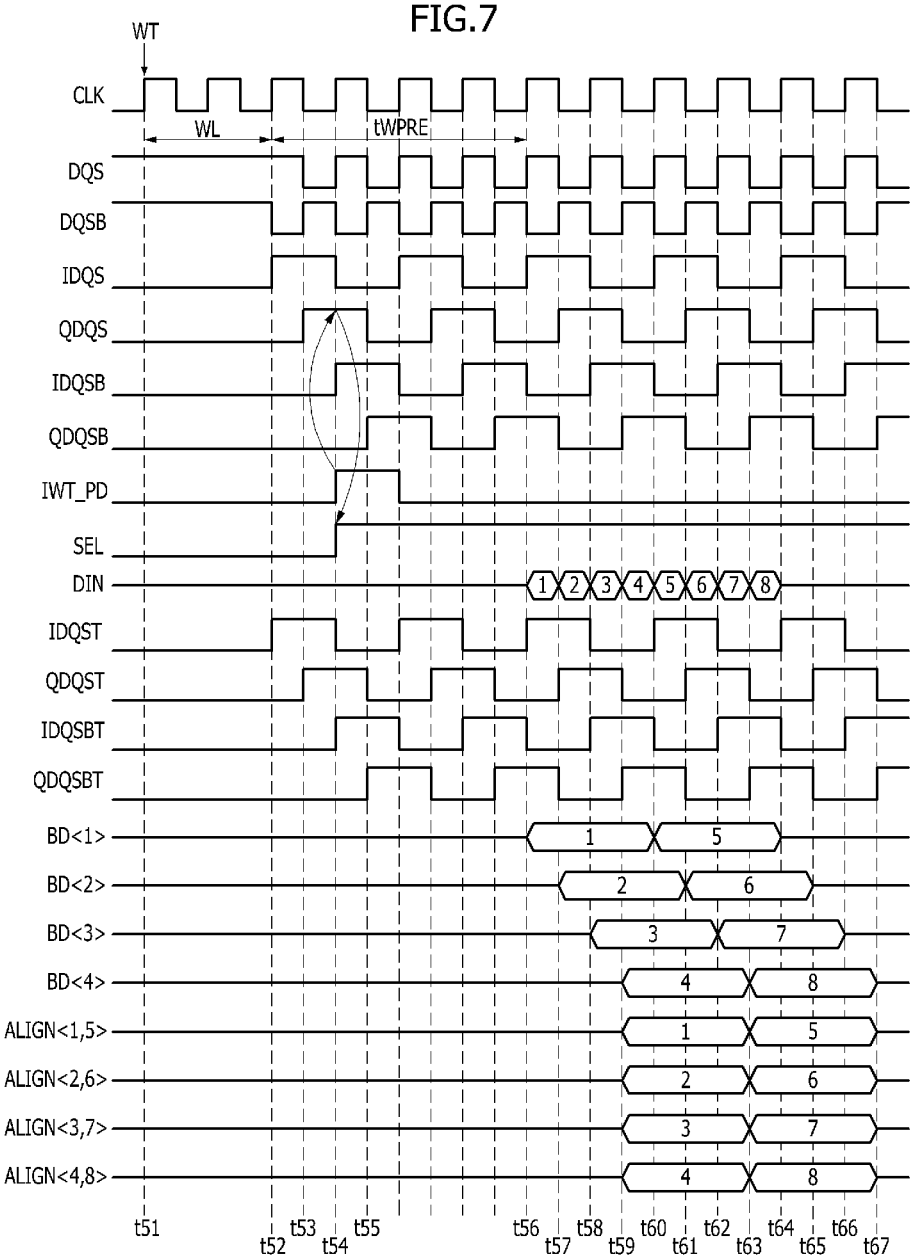
FIGS. 7 and 8 are timing diagrams illustrating operations of the deserializer shown in FIG. 5.

The second internal clock signal QDQS may have a logic "high" level at the point of time t54 that corresponds to a rising edge of the phase detection signal IWT_PD, as illustrated in FIG. 7. Thus, the selection signal SEL may be generated to have a logic "high" level from the point of time t54. As a result, the clock phase controller 7 may output the first to fourth internal clock signals IDQS, QDQS, IDQSB and QDQSB as the first to fourth transformed clock signals IDQST, QDQST, IDQSBT and QDQSBT.

The data aligner 10 may align the data DIN in response to the first to fourth transformed clock signals IDQST, QDQST, IDQSBT and QDQSBT to generate the first to eighth aligned data ALIGN<1:8>. In FIG. 7, reference designators t57, t58, t59, t60, t61, t62, t63, t64, t65, t66 and t67 denote points of time which are sequentially delayed from the point of time t56 by a half cycle of the system clock signal CLK, respectively.

The operation of the deserializer when the first to fourth internal clock signals IDQS, QDQS, IDQSB and QDQSB are generated to have the inversed phases will be described hereinafter with reference to FIG. 8.

If the write command signal WT is inputted at a point of time t71, the data DIN may be inputted to the data aligner 10 at a point of time t77 that the write latency WL and the preamble time tWPRE elapse from the point of time t71 and the phase detection signal IWT_PD may be generated at a point of time t73 that one cycle time 1tCK of the system clock signal CLK elapses from a point of time t72 that the write latency WL terminates.

The first to fourth internal clock signals IDQS, QDQS, IDQSB and QDQSB may be generated to have the inversed phases from the point of time t72 that the write latency WL terminates. That is, the first to fourth internal clock signals IDQS, QDQS, IDQSB and QDQSB may be sequentially generated to have the inversed phases from the point of time t72. Specifically, the first to fourth internal clock signals IDQS, QDQS, IDQSB and QDQSB may be shifted by a phase of 180 degrees as compared with the first to fourth internal clock signals IDQS, QDQS, IDQSB and QDQSB illustrated in FIG. 7.

Figure 8:
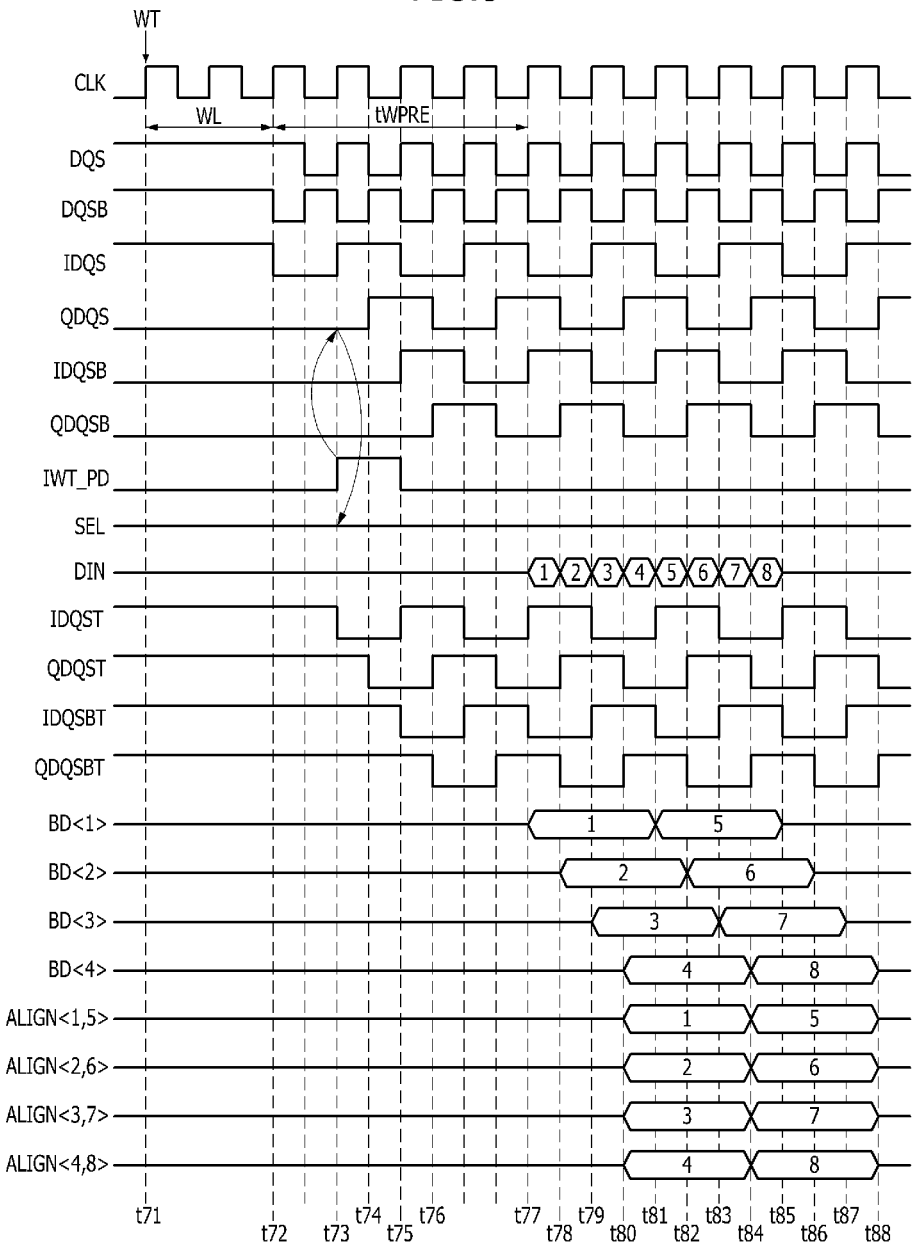

The second internal clock signal QDQS may have a logic "low" level at the point of time t73 that corresponds to a rising edge of the phase detection signal IWT_PD, as illustrated in FIG. 8. Thus, the selection signal SEL may be generated to have a logic "low" level. As a result, the clock phase controller 7 may invert the first to fourth internal clock signals IDQS, QDQS, IDQSB and QDQSB and may output the inverted signals of the first to fourth internal clock signals IDQS, QDQS, IDQSB and QDQSB as the first to fourth transformed clock signals IDQST, QDQST, IDQSBT and QDQSBT. That is, even though the first to fourth internal clock signals IDQS, QDQS, IDQSB and QDQSB of FIG. 8 have the inversed phases of the first to fourth internal clock signals IDQS, QDQS, IDQSB and QDQSB of FIG. 7, the first to fourth transformed clock signals IDQST, QDQST, IDQSBT and QDQSBT outputted from the clock phase controller 7 of FIG. 8 may be generated to have the same phases and cycles as the first to fourth transformed clock signals IDQST, QDQST, IDQSBT and QDQSBT of FIG. 7.

The data aligner 10 may align the data DIN in response to the first to fourth transformed clock signals IDQST, QDQST, IDQSBT and QDQSBT to generate the first to eighth aligned data ALIGN<1:8>. In FIG. 8, reference designators t74, t75 and t76 denote points of time which are sequentially delayed from the point of time t73 by a half cycle of the system clock signal CLK, respectively. In addition, reference designators t78, t79, t80, t81, t82, t83, t84, t85, t86, t87 and t88 denote points of time which are sequentially delayed from the point of time t77 by a half cycle of the system clock signal CLK, respectively.

As described above, when the internal clock signals are abnormally generated to have inversed phases, the deserializer according to the embodiments may invert the phases of the internal clock signals to generate the transformed clock signals and may align the input data, which are serially inputted, to output parallel data. Accordingly, the input data may be buffered and aligned in parallel without any errors even though the internal clock signals are abnormally generated to have the inversed phases.

Figure 9:
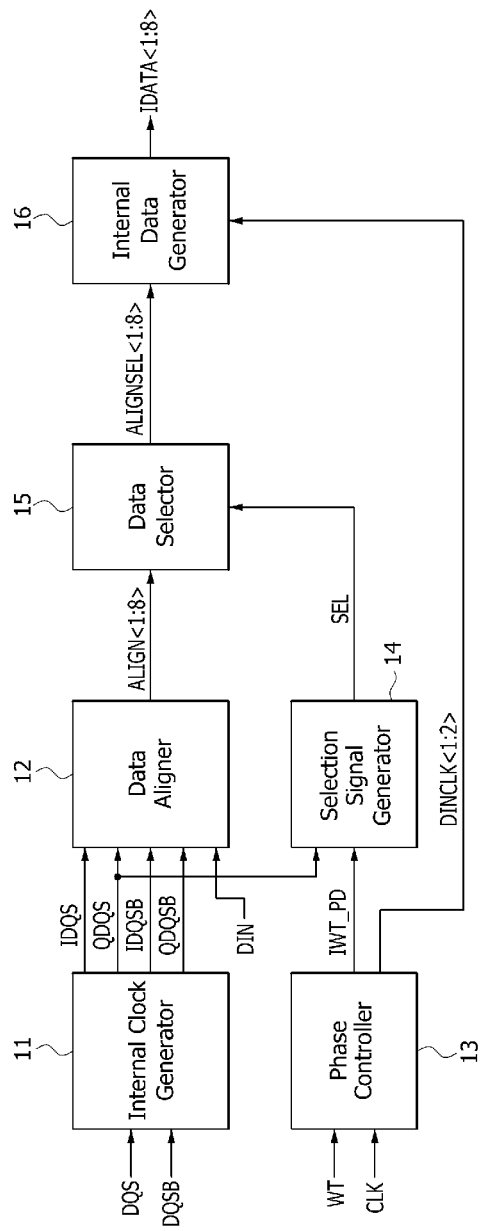
FIG. 9 is a block diagram illustrating a configuration of a deserializer according to an embodiment.

FIG. 9 is a block diagram illustrating a configuration of a deserializer according to various other embodiments.

As illustrated in FIG. 9, a deserializer according to various embodiments may be configured to include an internal clock generator 11, a data aligner 12, a phase controller 13, a selection signal generator 14, a data selector 15 and an internal data generator 16.

The internal clock generator 11 may divide a data strobe signal DQS and a complementary data strobe signal DQSB to generate a first internal clock signal IDQS, a second internal clock signal QDQS, a third internal clock signal IDQSB and a fourth internal clock signal QDQSB. The internal clock generator 11 may be configured to include a frequency divider. Accordingly, the first to fourth internal clock signals IDQS, QDQS, IDQSB and QDQSB may be generated to have a cycle time which is twice that of the data strobe signal DQS and the complementary data strobe signal DQSB. The first internal clock signal IDQS may precede the second internal clock signal QDQS by a phase of 90 degrees, the second internal clock signal QDQS may precede the third internal clock signal IDQSB by a phase of 90 degrees, and the third internal clock signal IDQSB may precede the fourth internal clock signal QDQSB by a phase of 90 degrees.

The data aligner 12 may align data DIN in response to the first to fourth internal clock signals IDQS, QDQS, IDQSB and QDQSB to generate first to eighth alignment data ALIGN<1:8>. Detailed descriptions to the configuration and operation of the data aligner 12 will be described with reference to FIG. 10 later.

The phase controller 13 may receive a write command signal WT and a write latency signal WLS to generate a phase detection signal IWT_PD including a first pulse which is created after a write latency WL (WL of FIGS. 12 and 13) and a predetermined period, which corresponds to "N" (wherein, "N" denotes a positive integer) times a cycle of the system clock signal CLK, elapse from a point of time that the write command signal WT is inputted. According to the present embodiment, in order to sense or detect the phase of the second internal clock signal QDQS, the first pulse of the phase detection signal IWT_PD may be created after the write latency WL and two cycles (2tCK) of the system clock signal CLK elapse from a point of time that the write command signal WT is applied to the phase controller 13. The first pulse may be created to have a pulse width corresponding to one cycle (1tCK) of the system clock signal CLK. Further, the phase controller 13 may receive the write command signal WT and write latency signal WLS to generate a first data input clock signal DINCLK<1> including a second pulse and a second data input clock signal DINCLK<2> including a third pulse, and the second and third pluses may be created after other predetermined periods corresponding to "N" (wherein, "N" denotes a positive integer) times a cycle of the system clock signal CLK elapse from a point of time that the write latency WL terminates. In the present embodiment, the second pulse may be created after the four cycles (4tCK) of the system clock signal CLK elapse from a point of time that the write latency WL terminates, and the third pulse may be created after five cycles (5tCK) of the system clock signal CLK elapse from a point of time that the write latency WL terminates. The second and third pulses may be created to have a pulse width corresponding to a half cycle of the system clock signal CLK. However, in various embodiments, the rising edge points and the pulse widths of the first to third pulses may vary according to design schemes.

The selection signal generator 14 may detect one of the first to fourth internal clock signals IDQS, QDQS, IDQSB and QDQSB in response to the phase detection signal IWT_PD to generate a selection signal SEL. In the present embodiments, a logic level of the selection signal SEL may be determined according to a phase of the second internal clock signal QDQS at a point of time that the phase detection signal IWT_PD is generated. That is, the selection signal SEL may be generated to have a logic "high" level when the second internal clock signal QDQS has a logic "high" level at a rising edge of the phase detection signal IWT_PD, and the selection signal SEL may be generated to have a logic "low" level when the second internal clock signal QDQS has a logic "low" level at a rising edge of the phase detection signal IWT_PD. When the selection signal SEL is generated to have a logic "high" level, the first to fourth internal clock signals IDQS, QDQS, IDQSB and QDQSB may be sequentially generated from a point of time that the data DIN is inputted. That is, if the first to fourth internal clock signals IDQS, QDQS, IDQSB and QDQSB are generated to have normal phases, the selection signal SEL may be generated to have a logic "high" level. Alternatively, when the selection signal SEL is generated to have a logic "low" level, the third, fourth, first and second internal clock signals IDQSB, QDQSB, IDQS and QDQS may be sequentially generated from a point of time that the data DIN is inputted. That is, if the first to fourth internal clock signals IDQS, QDQS, IDQSB and QDQSB are generated to have inversed phases, the selection signal SEL may be generated to have a logic "low" level. In various embodiments, the selection signal generator 14 may be configured to detect any one of the first to fourth internal clock signals IDQS, QDQS, IDQSB and QDQSB in response to the phase detection signal IWT_PD to generate the selection signal SEL.

The data selector 15 may receive the first to eighth alignment data ALIGN<1:8> to selectively output first to eighth selected alignment data ALIGNSEL<1:8> according to a logic level of the selection signal SEL. In the present embodiments, when the selection signal SEL has a logic "high" level, the data selector 15 may output a first alignment data group as a first selected alignment data group and may output a second alignment data group as a second selected alignment data group. The first alignment data group may include the first alignment data ALIGN<1>, the second alignment data ALIGN<2>, the fifth alignment data ALIGN<5> and the sixth alignment data ALIGN<6>, and the second alignment data group may include the third alignment data ALIGN<3>, the fourth alignment data ALIGN<4>, the seventh alignment data ALIGN<7> and the eighth alignment data ALIGN<8>. The first selected alignment data group may include the first selected alignment data ALIGNSEL<1>, the second selected alignment data ALIGNSEL<2>, the fifth selected alignment data ALIGNSEL<5> and the sixth selected alignment data ALIGNSEL<6>, and the second selected alignment data group may include the third selected alignment data ALIGNSEL<3>, the fourth selected alignment data ALIGNSEL<4>, the seventh selected alignment data ALIGNSEL<7> and the eighth selected alignment data ALIGNSEL<8>. In the present embodiments, when the selection signal SEL has a logic "low" level, the data selector 5 may output the first alignment data group as the second selected alignment data group and may output the second alignment data group as the first selected alignment data group. Detailed descriptions to the configuration and operation of the data selector 15 will be developed with reference to FIG. 11.

The internal data generator 16 may latch the first to eighth selected alignment data ALIGNSEL<1:8> in synchronization with the first and second data input clock signals DINCLK<1:2> to generate first to eighth internal data IDATA<1:8>. In the present embodiments, the internal data generator 16 may latch the first selected alignment data group in synchronization with the first data input clock signal DINCLK<1> to generate a first internal data group, and may latch the second selected alignment data group in synchronization with the second data input clock signal DINCLK<2> to generate a second internal data group. The first internal data group may include the first, second, fifth and sixth internal data IDATA<1>, IDATA<2>, IDATA<5> and IDATA<6>, and the second internal data group may include the third, fourth, seventh and eighth internal data IDATA<3>, IDATA<4>, IDATA<7> and IDATA<8>.

Figure 10:
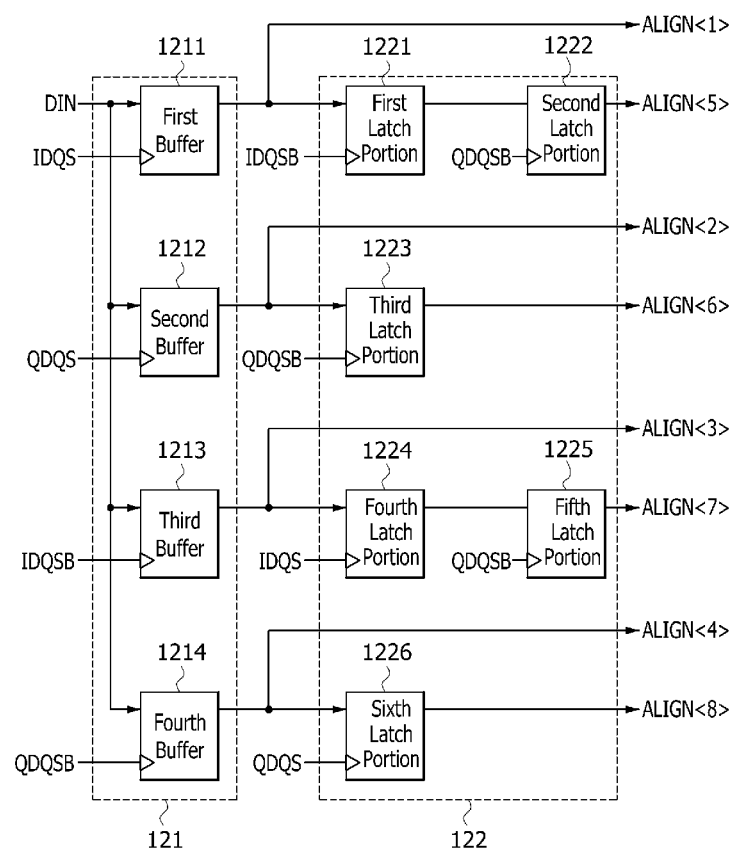
FIG. 10 is a block diagram illustrating a configuration of a data aligner included in the deserializer of FIG. 9.

FIG. 10 is a block diagram illustrating a configuration of the data aligner 12.

As illustrated in FIG. 10, the data aligner 12 may be configured to include a data buffer 121 and an aligner 122. The data buffer 121 may be configured to include a first buffer 1211, a second buffer 1212, a third buffer 1213 and a fourth buffer 1214. The aligner 122 may be configured to include a first latch portion 1221, a second latch portion 1222, a third latch portion 1223, a fourth latch portion 1224, a fifth latch portion 1225 and a sixth latch portion 1226.

The first buffer 1211 may buffer the data DIN in synchronization with a rising edge of the first internal clock signal IDQS to output the first alignment data ALIGN<1>. The second buffer 1212 may buffer the data DIN in synchronization with a rising edge of the second internal clock signal QDQS to output the second alignment data ALIGN<2>. The third buffer 1213 may buffer the data DIN in synchronization with a rising edge of the third internal clock signal IDQSB to output the third alignment data ALIGN<3>. The fourth buffer 1214 may buffer the data DIN in synchronization with a rising edge of the fourth internal clock signal QDQSB to output the fourth alignment data ALIGN<4>. In the present embodiments, each of the first to fourth buffers 1211, 1212, 1213 and 1214 may be realized to include a flip-flop. Thus, each of the first to fourth buffers 1211, 1212, 1213 and 1214 may latch and buffer its input data and may output the latched and buffered input data.

The first latch portion 1221 may latch and output the first alignment data ALIGN<1> in synchronization with a rising edge of the third internal clock signal IDQSB. The second latch portion 1222 may latch and output an output signal of the first latch portion 1221 in synchronization with a rising edge of the fourth internal clock signal QDQSB. The third latch portion 1223 may latch and output the second alignment data ALIGN<2> in synchronization with a rising edge of the fourth internal clock signal QDQSB. The fourth latch portion 1224 may latch and output the third alignment data ALIGN<3> in synchronization with a rising edge of the first internal clock signal IDQS. The fifth latch portion 1225 may latch and output an output signal of the fourth latch portion 1224 in synchronization with a rising edge of the fourth internal clock signal QDQSB. The sixth latch portion 1226 may latch and output the fourth alignment data ALIGN<4> in synchronization with a rising edge of the second internal clock signal QDQS. An output signal of the second latch portion 1222 may correspond to the fifth alignment data ALIGN<5>, and an output signal of the third latch portion 1223 may correspond to the sixth alignment data ALIGN<6>. Further, an output signal of the fifth latch portion 1225 may correspond to the seventh alignment data ALIGN<7>, and an output signal of the sixth latch portion 1226 may correspond to the eighth alignment data ALIGN<8>. In the present embodiments, each of the first to sixth latch portions 1221, 1222, 1223, 1224, 1225 and 1226 may be realized to include a flip-flop. Thus, each of the first to sixth latch portions 1221, 1222, 1223, 1224, 1225 and 1226 may latch and buffer its input data and may output the latched and buffered input data.

When the selection signal SEL has a logic "high" level, the data aligner 12 may sequentially latch the data DIN, which are serially inputted, in synchronization with the first to fourth internal clock signals IDQS, QDQS, IDQSB and QDQSB to sequentially generate the first to fourth alignment data ALIGN<1:4> at an interval of a half cycle (0.5tCK) of the system clock signal CLK. Further, when the selection signal SEL has a logic "high" level, the data aligner 12 may retard the first alignment data ALIGN<1> by one and half cycles (1.5tCK) of the system clock signal CLK to generate the fifth alignment data ALIGN<5>, may retard the second alignment data ALIGN<2> by one cycle (1tCK) of the system clock signal CLK to generate the sixth alignment data ALIGN<6>, may retard the third alignment data ALIGN<3> by one and half cycles (1.5tCK) of the system clock signal CLK to generate the seventh alignment data ALIGN<7>, and may retard the fourth alignment data ALIGN<4> by one cycle (1tCK) of the system clock signal CLK to generate the eighth alignment data ALIGN<8>. Alternatively, when the selection signal SEL has a logic "low" level, the data aligner 12 may sequentially latch the data DIN, which are serially inputted, in synchronization with the first to fourth internal clock signals IDQS, QDQS, IDQSB and QDQSB to sequentially generate the third, fourth, first and second alignment data ALIGN<3>, ALIGN<4>, ALIGN<1> and ALIGN<2> at an interval of a half cycle (0.5tCK) of the system clock signal CLK. Further, when the selection signal SEL has a logic "low" level, the data aligner 12 may retard the third alignment data ALIGN<3> by one and half cycles (1.5tCK) of the system clock signal CLK to generate the seventh alignment data ALIGN<7>, may retard the fourth alignment data ALIGN<4> by one cycle (1tCK) of the system clock signal CLK to generate the eighth alignment data ALIGN<8>, may retard the first alignment data ALIGN<1> by one and half cycles (1.5tCK) of the system clock signal CLK to generate the fifth alignment data ALIGN<5>, and may retard the second alignment data ALIGN<2> by one cycle (1tCK) of the system clock signal CLK to generate the sixth alignment data ALIGN<6>.

Figure 11:
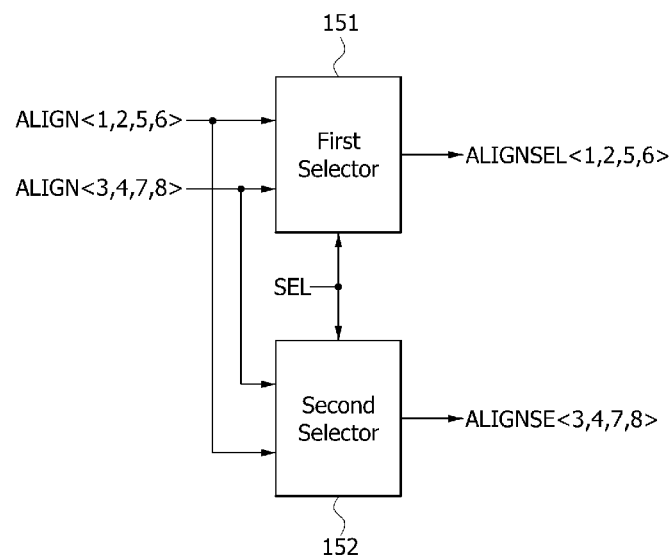
FIG. 11 is a block diagram illustrating a configuration of a data selector included in the deserializer of FIG. 9.

FIG. 11 is a block diagram illustrating a configuration of the data selector 15.

As illustrated in FIG. 11, the data selector 15 may be configured to include a first selector 151 and a second selector 152. The first selector 151 may output the first alignment data group ALIGN<1, 2, 5, 6> as the first selected alignment data group ALIGNSEL<1, 2, 5, 6> when the selection signal SEL has a logic "high" level, and the first selector 151 may output the second alignment data group ALIGN<3, 4, 7, 8> as the first selected alignment data group ALIGNSEL<1, 2, 5, 6> when the selection signal SEL has a logic "low" level. The second selector 152 may output the second alignment data group ALIGN<3, 4, 7, 8> as the second selected alignment data group ALIGNSEL<3, 4, 7, 8> when the selection signal SEL has a logic "high" level, and the second selector 152 may output the first alignment data group ALIGN<1, 2, 5, 6> as the second selected alignment data group ALIGNSEL<3, 4, 7, 8> when the selection signal SEL has a logic "low" level.

Figure 12:
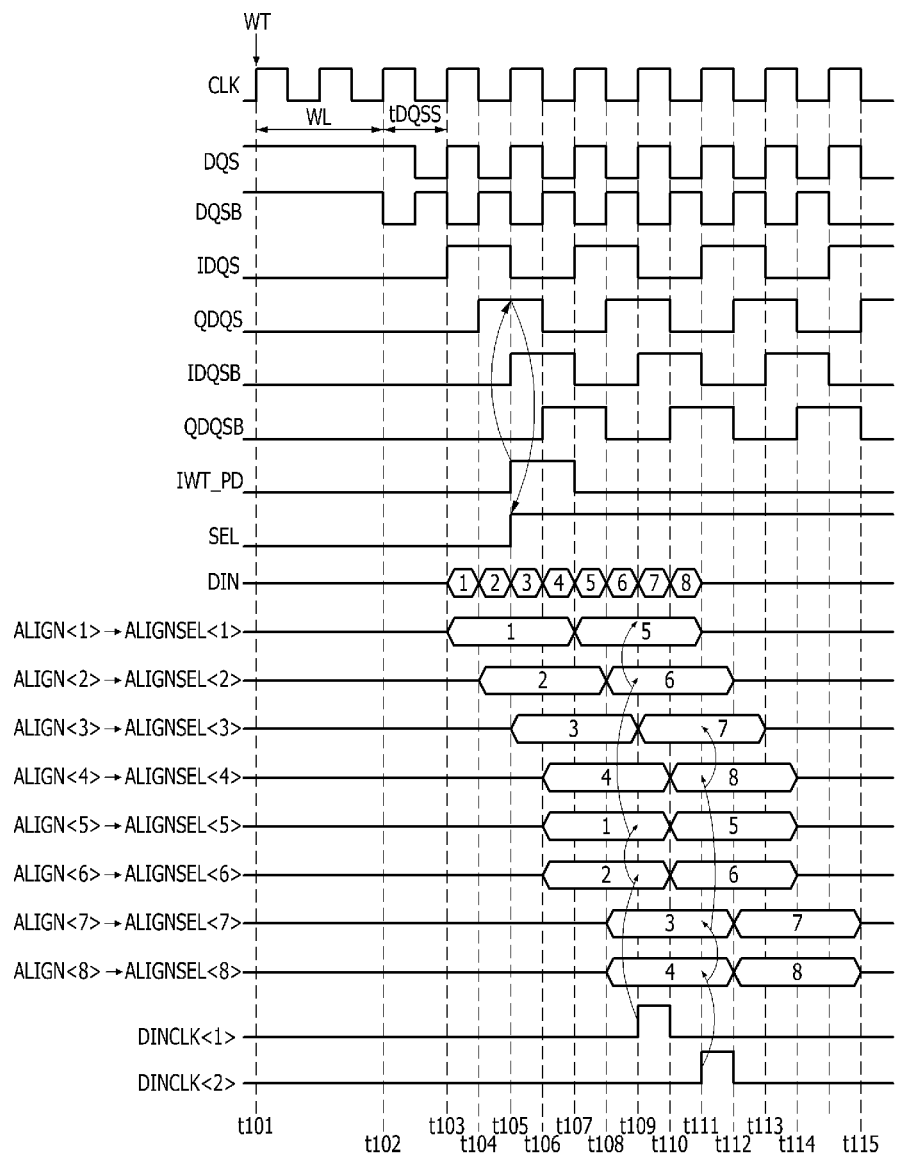
FIGS. 12 and 13 are timing diagrams illustrating operations of the deserializer shown in FIG. 9.
Figure 13:
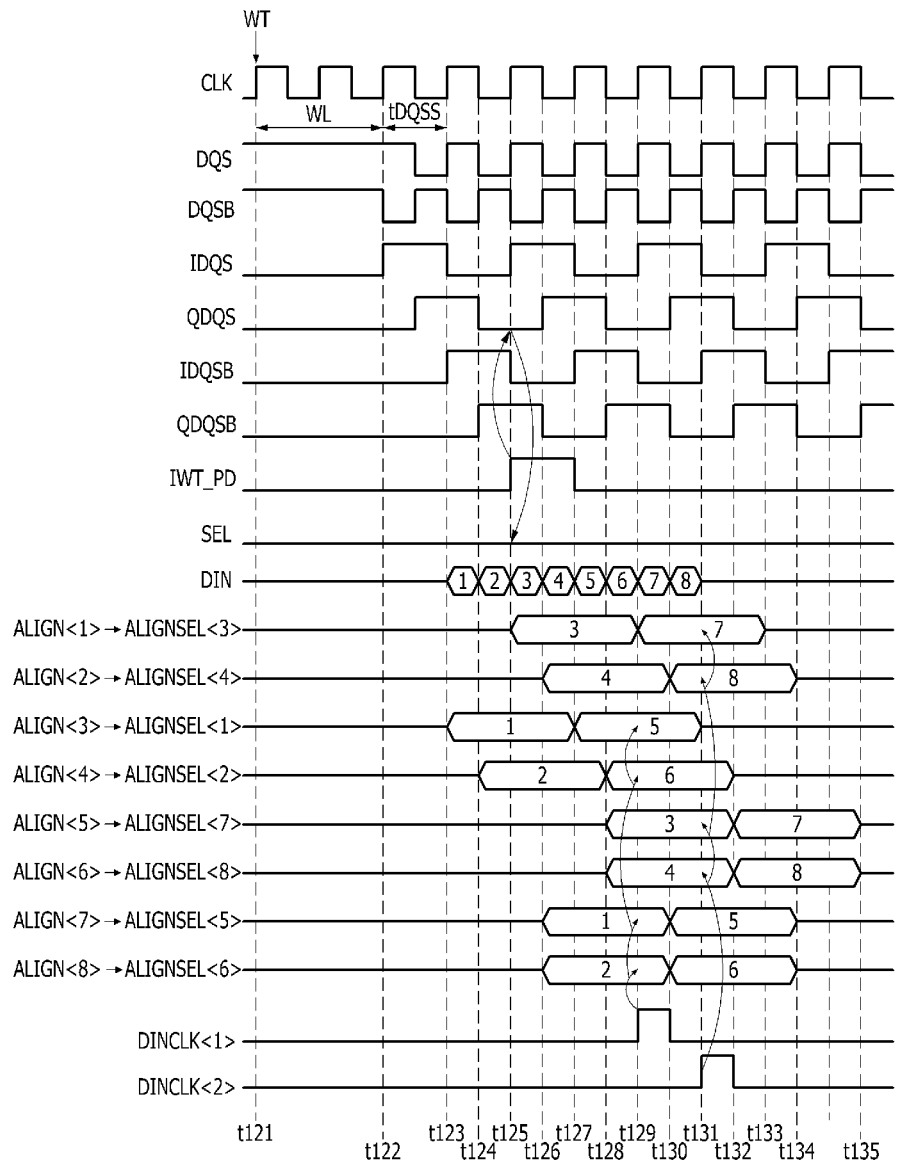

The operations of the aforementioned deserializer will be described more fully hereinafter with reference to FIGS. 12 and 13. The operation of the deserializer when the first to fourth internal clock signals IDQS, QDQS, IDQSB and QDQSB have normal phases to generate the selection signal SEL having a logic "high" level will be described with reference to FIG. 12, and the operation of the deserializer when the first to fourth internal clock signals IDQS, QDQS, IDQSB and QDQSB abnormally have inversed phases to generate the selection signal SEL having a logic "low" level will be described with reference to FIG. 13. In the present embodiments, for the purpose of ease and convenience in explanation, it is assumed that the write latency WL is set to "2" and a time tDQSS is set to one cycle "1tCK" of the system clock signal CLK. The time tDQSS denotes a limit or specification of a domain crossing margin between the data strobe signal DQS and the system clock signal CLK. That is, the time tDQSS may be defined as a minimum period which is necessary to generate a valid data strobe signal DQS in synchronization with the system clock signal CLK. A preamble time tWPRE may be defined as a period between a point of time that the write latency WL terminates and a point of time that the data DIN is inputted. Although the preamble time tWPRE is set to be equal to the time tDQSS in the present embodiments, the preamble time tWPRE may be set to have "tDQSS+positive integer×tCK" in various embodiments.

Now, the operation of the deserializer when the first to fourth internal clock signals IDQS, QDQS, IDQSB and QDQSB are generated to have the normal phases will be described hereinafter with reference to FIG. 12.

If the write command signal WT is inputted at a point of time t101, the data DIN may be inputted to the data aligner 12 at a point of time t103 that the write latency WL and the time tDQSS elapse from the point of time t101 and the first pulse of the phase detection signal IWT_PD may be created at a point of time t105 that two cycles (2tCK) of the system clock signal CLK elapse from a point of time t102 that the write latency WL terminates. Since the second internal clock signal QDQS has a logic "high" level at the point of time t105 that corresponds to a rising edge of the phase detection signal IWT_PD, the selection signal SEL may be generated to have a logic "high" level from the point of time t105. The second pulse of the first data input clock signal DINCLK<1> may be created at a point of time t109 that four cycles (4tCK) of the system clock signal CLK elapse from the point of time t102 that the write latency WL terminates. Further, the third pulse of the second data input clock signal DINCLK<2> may be created at a point of time t111 that five cycles (5tCK) of the system clock signal CLK elapse from the point of time t102 that the write latency WL terminates.

The first to fourth internal clock signals IDQS, QDQS, IDQSB and QDQSB may be normally generated from the point of time t103 that the time tDQSS elapses after the point of time t102 that the write WL terminates. That is, the first internal clock signal IDQS may be normally generated to have a predetermined cycle time from the point of time t103, and the second internal clock signal QDQS may be normally generated to have the predetermined cycle time from a point of time t104 which is delayed from the point of time t103 by a phase of 90 degrees. Further, the third internal clock signal IDQSB may be normally generated to have the predetermined cycle time from the point of time t105 which is delayed from the point of time t104 by a phase of 90 degrees, and the fourth internal clock signal QDQSB may be normally generated to have the predetermined cycle time from a point of time t106 which is delayed from the point of time t105 by a phase of 90 degrees.

The data aligner 12 may sequentially latch the data DIN, which are serially inputted, in synchronization with the system clock signal CLK to generate the first to fourth alignment data ALIGN<1:4> in order at an interval of a half cycle (0.5tCK) of the system clock signal CLK. The first alignment data ALIGN<1> may be generated by latching a first data of the data DIN from the point of time t103 till a point of time t107 that two cycles (2tCK) of the system clock signal CLK elapse from the point of time t103 and by latching a fifth data of the data DIN from the point of time t107 till a point of time t111 that two cycles (2tCK) of the system clock signal CLK elapse from the point of time t107. The second alignment data ALIGN<2> may be generated by latching a second data of the data DIN from the point of time t104 till a point of time t108 that two cycles (2tCK) of the system clock signal CLK elapse from the point of time t104 and by latching a sixth data of the data DIN from the point of time t108 till a point of time t112 that two cycles (2tCK) of the system clock signal CLK elapse from the point of time t108. The third alignment data ALIGN<3> may be generated by latching a third data of the data DIN from the point of time t105 till the point of time t109 that two cycles (2tCK) of the system clock signal CLK elapse from the point of time t105 and by latching a seventh data of the data DIN from the point of time t109 till a point of time t113 that two cycles (2tCK) of the system clock signal CLK elapse from the point of time t109. The fourth alignment data ALIGN<4> may be generated by latching a fourth data of the data DIN from the point of time t106 till a point of time t110 that two cycles (2tCK) of the system clock signal CLK elapse from the point of time t106 and by latching an eighth data of the data DIN from the point of time t110 till a point of time t114 that two cycles (2tCK) of the system clock signal CLK elapse from the point of time t110.

The data aligner 12 may retard the first alignment data ALIGN<1> by one and half cycles (1.5tCK) of the system clock signal CLK to generate the fifth alignment data ALIGN<5>, may retard the second alignment data ALIGN<2> by one cycle (1tCK) of the system clock signal CLK to generate the sixth alignment data ALIGN<6>, may retard the third alignment data ALIGN<3> by one and half cycles (1.5tCK) of the system clock signal CLK to generate the seventh alignment data ALIGN<7>, and may retard the fourth alignment data ALIGN<4> by one cycle (1tCK) of the system clock signal CLK to generate the eighth alignment data ALIGN<8>. As a result, the fifth alignment data ALIGN<5> may be generated by latching the first data of the data DIN from the point of time t106 till the point of time t110 and by latching the fifth data of the data DIN from the point of time t110 till the point of time t114, and the sixth alignment data ALIGN<6> may be generated by latching the second data of the data DIN from the point of time t106 till the point of time t110 and by latching the sixth data of the data DIN from the point of time t110 till the point of time t114. Further, the seventh alignment data ALIGN<7> may be generated by latching the third data of the data DIN from the point of time t108 till the point of time t112 and by latching the seventh data of the data DIN from the point of time t112 till a point of time t115 that two cycles (2tCK) of the system clock signal CLK elapse from the point of time t112, and the eighth alignment data ALIGN<8> may be generated by latching the fourth data of the data DIN from the point of time t108 till the point of time t112 and by latching the eighth data of the data DIN from the point of time t112 till the point of time t115.

The data selector 15 may receive the selection signal SEL having a logic "high" level to output the first alignment data group ALIGN<1, 2, 5, 6> as the first selected alignment data group ALIGNSEL<1, 2, 5, 6> and to output the second alignment data group ALIGN<3, 4, 7, 8> as the second selected alignment data group ALIGNSEL<3, 4, 7, 8>.

The internal data generator 16 may latch the first selected alignment data group ALIGNSEL<1, 2, 5, 6> in synchronization with the point of time t109 that the second pulse of the first data input clock signal DINCLK<1> is inputted, thereby generating a first internal data group IDATA<1, 2, 5, 6>. In addition, the data selector 15 may latch the second selected alignment data group ALIGNSEL<3, 4, 7, 8> in synchronization with the point of time t111 that the third pulse of the second data input clock signal DINCLK<2> is inputted, thereby generating a second internal data group IDATA<3, 4, 7, 8>.

The operation of the deserializer when the first to fourth internal clock signals IDQS, QDQS, IDQSB and QDQSB are generated to have the inversed phases will be described hereinafter with reference to FIG. 13.

If the write command signal WT is inputted at a point of time t121, the data DIN may be inputted to the data aligner 12 at a point of time t123 that the write latency WL and the time tDQSS elapse from the point of time t121 and the first pulse of the phase detection signal IWT_PD may be created at a point of time t125 that two cycles (2tCK) of the system clock signal CLK elapse from a point of time t122 that the write latency WL terminates. Since the second internal clock signal QDQS has a logic "low" level at the point of time t125 that corresponds to a rising edge of the phase detection signal IWT_PD, the selection signal SEL may be generated to have a logic "low" level from the point of time t125. The second pulse of the first data input clock signal DINCLK<1> may be created at a point of time t129 that four cycles (4tCK) of the system clock signal CLK elapse from the point of time 122 that the write latency WL terminates. Further, the third pulse of the second data input clock signal DINCLK<2> may be created at a point of time t131 that five cycles (5tCK) of the system clock signal CLK elapse from the point of time t122 that the write latency WL terminates.

The first to fourth internal clock signals IDQS, QDQS, IDQSB and QDQSB may be abnormally generated to have inversed phases from the point of time t123 that the time tDQSS elapses after the point of time t122 that the write latency WL terminates. That is, the third internal clock signal IDQSB may be abnormally generated to have a predetermined cycle time from the point of time t123, and the fourth internal clock signal QDQSB may be abnormally generated to have the predetermined cycle time from a point of time t124 which is delayed from the point of time t123 by a phase of 90 degrees. Further, the first internal clock signal IDQS may be abnormally generated to have the predetermined cycle time from the point of time t125 which is delayed from the point of time t124 by a phase of 90 degrees, and the second internal clock signal QDQS may be abnormally generated to have the predetermined cycle time from a point of time t126 which is delayed from the point of time t125 by a phase of 90 degrees.

The data aligner 12 may sequentially latch the data DIN, which are serially inputted, in synchronization with the system clock signal CLK to generate the third, fourth, first and second alignment data ALIGN<3, 4, 1, 2> in order at an interval of a half cycle (0.5tCK) of the system clock signal CLK. The third alignment data ALIGN<3> may be generated by latching a first data of the data DIN from the point of time t123 till a point of time t127 that two cycles (2tCK) of the system clock signal CLK elapse from the point of time t123 and by latching a fifth data of the data DIN from the point of time t127 till a point of time t131 that two cycles (2tCK) of the system clock signal CLK elapse from the point of time t127. The fourth alignment data ALIGN<4> may be generated by latching a second data of the data DIN from the point of time t124 till a point of time t128 that two cycles (2tCK) of the system clock signal CLK elapse from the point of time t124 and by latching a sixth data of the data DIN from the point of time t128 till a point of time t132 that two cycles (2tCK) of the system clock signal CLK elapse from the point of time t128. The first alignment data ALIGN<1> may be generated by latching a third data of the data DIN from the point of time t125 till the point of time t129 that two cycles (2tCK) of the system clock signal CLK elapse from the point of time t125 and by latching a seventh data of the data DIN from the point of time t129 till a point of time t133 that two cycles (2tCK) of the system clock signal CLK elapse from the point of time t129. The second alignment data ALIGN<2> may be generated by latching a fourth data of the data DIN from the point of time t126 till a point of time t130 that two cycles (2tCK) of the system clock signal CLK elapse from the point of time t126 and by latching an eighth data of the data DIN from the point of time t130 till a point of time t134 that two cycles (2tCK) of the system clock signal CLK elapse from the point of time t130.

The data aligner 12 may retard the first alignment data ALIGN<1> by one and half cycles (1.5tCK) of the system clock signal CLK to generate the fifth alignment data ALIGN<5>, may retard the second alignment data ALIGN<2> by one cycle (1tCK) of the system clock signal CLK to generate the sixth alignment data ALIGN<6>, may retard the third alignment data ALIGN<3> by one and half cycles (1.5tCK) of the system clock signal CLK to generate the seventh alignment data ALIGN<7>, and may retard the fourth alignment data ALIGN<4> by one cycle (1tCK) of the system clock signal CLK to generate the eighth alignment data ALIGN<8>. As a result, the seventh alignment data ALIGN<7> may be generated by latching the first data of the data DIN from the point of time t126 till the point of time t130 and by latching the fifth data of the data DIN from the point of time t130 till the point of time t134, and the eighth alignment data ALIGN<8> may be generated by latching the second data of the data DIN from the point of time t126 till the point of time t130 and by latching the sixth data of the data DIN from the point of time t130 till the point of time t134. Further, the fifth alignment data ALIGN<5> may be generated by latching the third data of the data DIN from the point of time t128 till the point of time t132 and by latching the seventh data of the data DIN from the point of time t132 till a point of time t135 that two cycles (2tCK) of the system clock signal CLK elapse from the point of time t132, and the sixth alignment data ALIGN<6> may be generated by latching the fourth data of the data DIN from the point of time t128 till the point of time t132 and by latching the eighth data of the data DIN from the point of time t132 till the point of time t135.

The data selector 15 may receive the selection signal SEL having a logic "low" level to output the second alignment data group ALIGN<3, 4, 7, 8> as the first selected alignment data group ALIGNSEL<1, 2, 5, 6> and to output the first alignment data group ALIGN<1, 2, 5, 6> as the second selected alignment data group ALIGNSEL<3, 4, 7, 8>.

The internal data generator 16 may latch the first selected alignment data group ALIGNSEL<1, 2, 5, 6> in synchronization with the point of time t129 that the second pulse of the first data input clock signal DINCLK<1> is inputted, thereby generating a first internal data group IDATA<1, 2, 5, 6>. In addition, the data selector 15 may latch the second selected alignment data group ALIGNSEL<3, 4, 7, 8> in synchronization with the point of time t131 that the third pulse of the second data input clock signal DINCLK<2> is inputted, thereby generating a second internal data group IDATA<3, 4, 7, 8>.

As described above, the deserializer according to the embodiments may align the data in any case that the internal clock signals are normally or abnormally generated and may divide the aligned data into two groups to selectively output the aligned data in parallel. Accordingly, the data may be aligned in parallel without any errors even though the internal clock signals are abnormally generated to have inversed phases.

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A deserializer comprising:
    a selection signal generator configured to detect a phase of one of an internal clock signals in response to a phase detection signal including a pulse generated according to a write command signal and a write latency signal to generate a selection signal;
    a clock phase controller configured to output the internal clock signals or inversed signals of the internal clock signals as transformed clock signals in response to the selection signal; and
    a data aligner configured to align data in response to the transformed clock signals to generate aligned data.

2. The deserializer of claim 1, wherein the internal clock signals include first to fourth internal clock signals and the transformed clock signals include first to fourth transformed clock signals.

3. The deserializer of claim 2, wherein the first to fourth internal clock signals are generated by dividing frequencies of a data strobe signal and a complementary data strobe signal.

4. The deserializer of claim 3, wherein the first to fourth internal clock signals are generated to have a period which is twice that of the data strobe signal and the complementary data strobe signal.

5. The deserializer of claim 3, wherein the first internal clock signal precedes the second internal clock signal by a phase of 90 degrees, the second internal clock signal precedes the third internal clock signal by a phase of 90 degrees, and the third internal clock signal precedes the fourth internal clock signal by a phase of 90 degrees.

6. The deserializer of claim 5, further comprising:
    a phase detection signal generator configured to generate the phase detection signal including the pulse generated according to the write command signal and the write latency signal;

wherein the phase detection signal is generated after the write latency and "N" (wherein, "N" denotes a positive integer) times a cycle of a system clock signal elapse from a point of time that the write command signal is inputted into the phase detection signal generator.

7. The deserializer of claim 6, wherein a logic level of the selection signal is determined according to a phase of the second internal clock signal in synchronization with the phase detection signal.

8. The deserializer of claim 7, wherein the clock phase controller is configured to output the first to fourth internal clock signals as the first to fourth transformed clock signals when the selection signal has a first logic level and is configured to output the inversed signals of the first to fourth internal clock signals as the first to fourth transformed clock signals when the selection signal has a second logic level which is different from the first logic level.

9. The deserializer of claim 5, wherein the data aligner is configured to include a data buffer that sequentially buffers the data in synchronization with the first to fourth transformed clock signals to generate first to fourth buffer data.

10. The deserializer of claim 9:
wherein the aligned data include first to eighth aligned data; and
wherein the data aligner latches the first buffer data in synchronization with the second and fourth transformed clock signals to generate the first and fifth aligned data, latches the second buffer data in synchronization with the third and fourth transformed clock signals to generate the second and sixth aligned data, latches the third buffer data in synchronization with the fourth transformed clock signals to generate the third and seventh aligned data, and latches the fourth buffer data in synchronization with the fourth transformed clock signals to generate the fourth and eighth aligned data.

11. A deserializer comprising:
an internal clock generator configured to divide a data strobe signal and a complementary data strobe signal to generate internal clock signals;
a phase detection signal generator configured to generate a phase detection signal including a pulse generated according to a write command signal and a write latency signal;
a selection signal generator configured to detect a phase of one of the internal clock signals in response to the phase detection signal to generate a selection signal;
a clock phase controller configured to output the internal clock signals or inversed signals of the internal clock signals as transformed clock signals in response to the selection signal; and
a data aligner configured to align data in response to the transformed clock signals to generate aligned data.

12. The deserializer of claim 11, wherein the internal clock signals include first to fourth internal clock signals and the transformed clock signals include first to fourth transformed clock signals.

* * * * *